United States Patent [19]

Yen

[11] Patent Number: 4,711,350
[45] Date of Patent: Dec. 8, 1987

[54] INSPECTABLE ANTISTATIC CONTAINER FOR PACKING ELECTRICAL OR ELECTRONIC DEVICES

[76] Inventor: Wei Hsiung Yen, 8, Chia Ping Road, #01-01/08 S'pore, Singapore, Singapore, 2261

[21] Appl. No.: 923,207

[22] Filed: Oct. 27, 1986

[51] Int. Cl.[4] ................. B65D 85/42; B65D 65/18
[52] U.S. Cl. ................. 206/328; 206/334; 206/45.34; 361/220
[58] Field of Search ............ 206/328, 334, 331, 45.34, 206/521; 361/212, 220

[56] References Cited

U.S. PATENT DOCUMENTS

| | | |
|---|---|---|
| 2,302,933 | 11/1942 | Barol . |
| 2,949,182 | 8/1960 | Williams . |
| 3,435,949 | 4/1969 | Suverkropp . |
| 3,645,281 | 2/1972 | Seidler . |
| 3,761,861 | 9/1973 | Bailey . |
| 4,037,267 | 7/1977 | Kisor . |
| 4,327,332 | 4/1982 | Malchow . |
| 4,327,832 | 5/1982 | de Matteo ........................ 206/334 |
| 4,565,288 | 1/1986 | Walther ........................... 206/334 |
| 4,598,820 | 7/1986 | Murphy ............................ 206/328 |

FOREIGN PATENT DOCUMENTS

| | | |
|---|---|---|
| 01123 | 12/1979 | World Int. Prop. O. ........ 206/334 |
| 79/01123 | 12/1979 | PCT Int'l Appl. . |
| 2127380B | 4/1984 | United Kingdom . |
| 2150918A | 7/1985 | United Kingdom . |

Primary Examiner—Joseph Man-Fu Moy
Attorney, Agent, or Firm—Holman & Stern

[57] ABSTRACT

A container system is useful for storing, shipping and feeding electrical components which may be sensitive to exposure to static electrical charges. The container is a tubular casing fabricated predominantly from transparent plastics and has multiple lengthwise inset shoulders which restrict the movement of contained electrical components which can engage only the surfaces of the inset shoulders. Those surfaces of the inset shoulders which can engage the contained electrical component are formed from electrically conductive material. The transparency of the container allows easy inspection of the contained articles without disturbing the packaging thereof.

7 Claims, 12 Drawing Figures

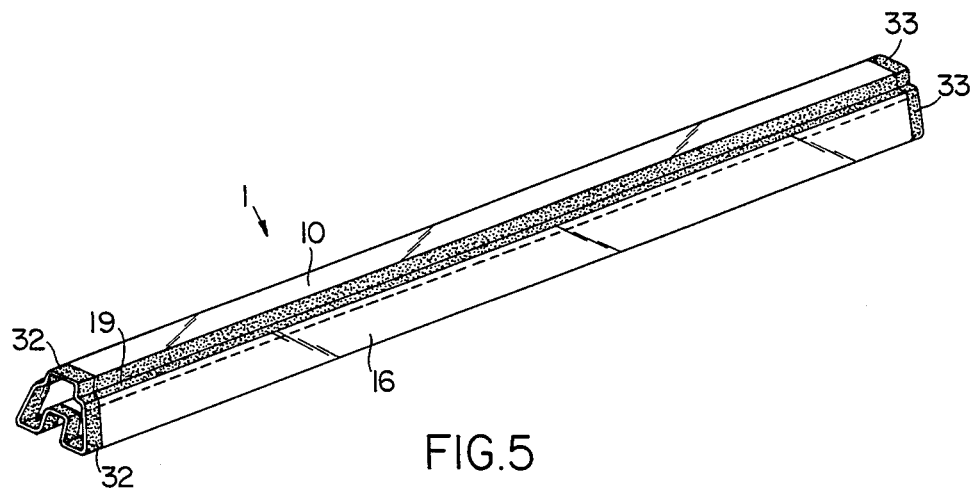
FIG. 5
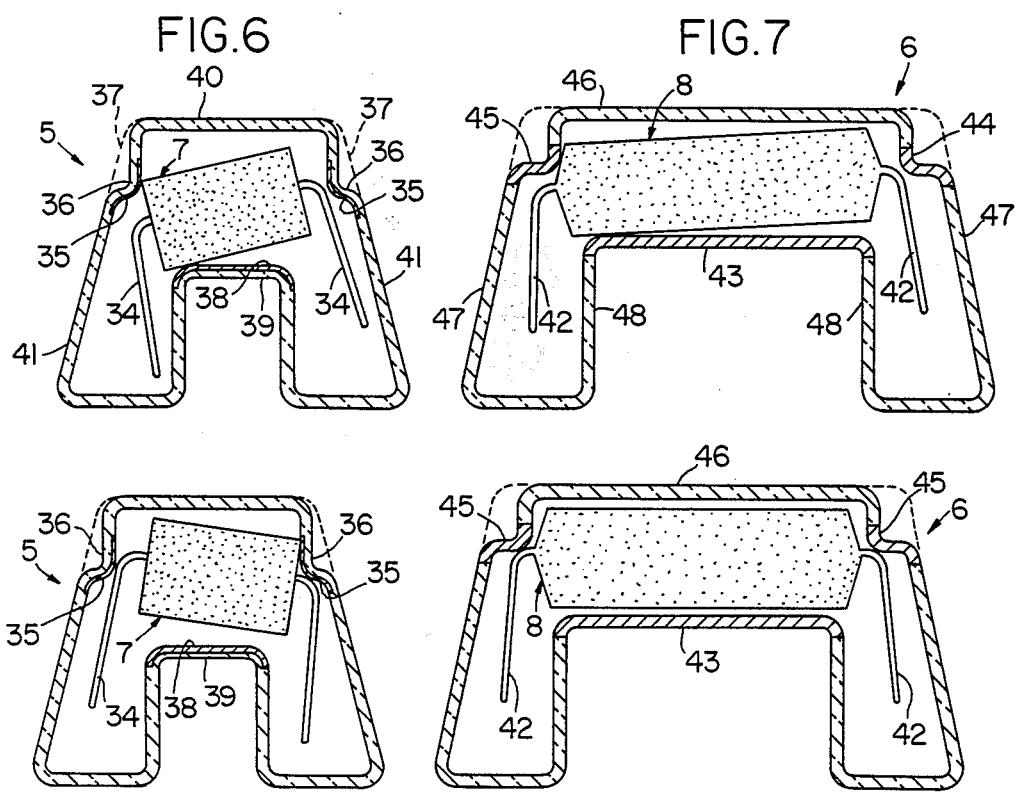
FIG. 6
FIG. 7
FIG. 8
FIG. 9

INSPECTABLE ANTISTATIC CONTAINER FOR PACKING ELECTRICAL OR ELECTRONIC DEVICES

BACKGROUND OF THE INVENTION

Field of the Invention

This invention relates to inexpensive, disposable containers for shipping and storing electrical or electronic components, more particularly semi-conductor electrical components, integrated circuits and like sensitive to exposure to static electrical charges. The device of the present invention also serves as a container permitting visual inspection of the components.

Description of the Prior Art

A typical disposable container for electrical components is described in PCT International application W079/01123. A similar container having a transparent portion is described in U.S. Pat. No. 4,327,832. Another prior art device is shown in U.K. Pat. No. 1593760, relating to improvements in the packaging of dual-in-line electrical components.

The containers known in the prior art are fabricated primarily from opaque electrical-conducting plastics material wherein all surfaces of the contained electrical component can engage only the electrical-conducting plastic substance. The prior containers have small transparent areas to permit limited inspection of the contents. The container of U.S. Pat. No. 4,327,832 has lengthwise ribs of electrical conducting plastic to restrict movement of the electrical components. The device of the present invention provides for a much greater viewing area and thus alleviates the problems and drawbacks encountered in the heretofore known containers.

SUMMARY OF THE INVENTION

It is, therefore, an object of the present invention to provide a substantially transparent container to permit viewing of the contained electrical components.

It is a further object of the present invention to reduce the cost of manufacturing the container.

An additional object of the present invention is to provide a container which protects the articles packaged therein from static electric discharge.

Further objects and advantages of the present invention will become apparent from the following description of the present invention.

BRIEF DESCRIPTION OF THE DRAWINGS

These and other objects, features, and attendant advantages of the invention will be better understood upon a reading of the following detailed description when considered in connection with the accompanying drawings wherein like parts in each of the several figures are identified by the same reference numbers, and wherein:

FIG. 5 is a perspective view of a container according to the present invention;

FIG. 6 is a side sectional view of a container similar to that shown in FIG. 2 and having an electrical component therein;

FIG. 7 is a side sectional view of a container similar to that shown in FIG. 1, and having an electrical component therein;

FIG. 8 is a sectional view similar to that shown in FIG. 6, wherein an electrical component is urged upwardly relative to the container orientation;

FIG. 9 is a sectional view similar to FIG. 7, wherein an electrical component is urged upwardly with respect to the container orientation;

DETAILED DESCRIPTION OF THE INVENTION

In the practice of the present invention any suitable transparent plastics material can be employed. Examples of preferred plastics material are polyvinylchloride (PVC), acrylic or other similar materials.

Transparent plastic substances also reduce the cost of the container because transparent plastic substances are less costly than electrically conducting plastic substances which are usually opaque; i.e., there are no known transparent electrically conducting plastic substances. Electrically conducting plastics are generally made by incorporating carbon particles therein. However, any other electrically conducting plastics material can also be used.

The present invention includes an elongated tubular casing, shaped to receive one or more electrical components and contoured with lengthwise inset shoulders and an inset base to restrict random motion of contained components. The interior surface of the lengthwise inset shoulders and of the inset base are lengthwise strips of electrically conducting material and are the only surfaces which engage the contained electrical component or components. The container protects electrical components from damage due to static electrical potentials while simultaneously shielding the components from dust and mechanical damage.

The container according to the present invention preferably is formed by extrusion of transparent plastic substances and electrically conducting plastic substances. The electrical conducting plastic substance strengthens the portions of the lengthwise inset shoulders to at least a slight degree. Alternatively, the present container may be formed solely from transparent plastic substances with films of an electrically conducting substance applied to the inner surfaces of the lengthwise inset shoulders of the container, e.g., strips of electrically conducting plastic film, strips of metal foil, or coatings. These electrical conducting materials can also be used for providing electromagnetic interference (EMI) shielding.

Figure 1:
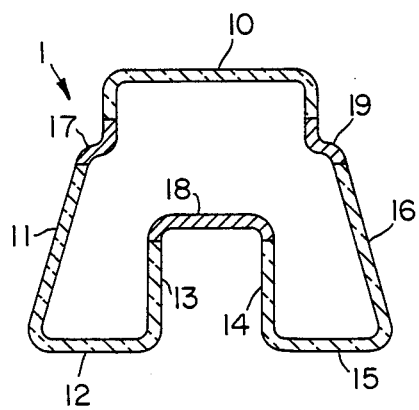
FIG. 1 is a section side view of a first embodiment of a container according to the present invention.

FIG. 1 shows a first embodiment of the present invention, including a container 1 having transparent walls 10, 11, 12, 13, 14, 15, and 16. The container 1 has opaque, electrically conductive walls 17, 18, and 19. The walls 17, 18, and 19 are electrically conducting strips.

The walls 17 and 19 are formed as inset shoulders. The electrically conducting strip 18 is formed as a bottom wall for supporting a component. The container 1 is oriented in a way as would be used when the container is stacked atop other containers of like shape and form. However, the container 1 is not necessarily used only in this orientation, and therefore any relative terms such as "bottom", "top", and the like are merely with reference to the orientation shown in the figure, rather than to any absolute orientation in which the container is to be used.

Figure 2:
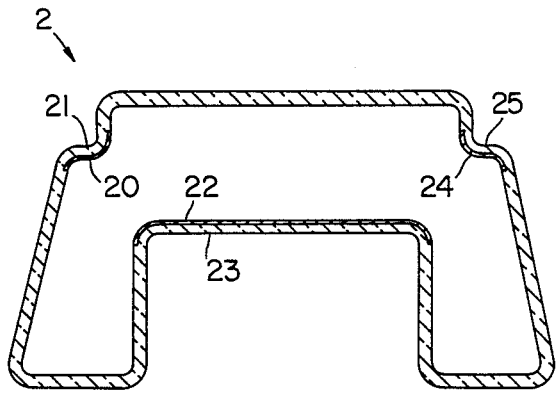
FIG. 2 is a side sectional view of another embodiment of the container according to the present invention.

FIG. 2 is a view similar to that shown in FIG. 1, wherein the conductive portions of a container 2 are formed by thin films 20, 22, and 24. The remainder of the body is of transparent plastic, which is non-conductive. The conductive portions 20 and 24 form shoulders, and are supported by the shoulder portions 21 and 25 which are formed of transparent plastic material. Similarly, the bottom strip 22 is supported by the bottom wall 23, the bottom wall 23 being of transparent non-conductive plastic.

Figure 3:
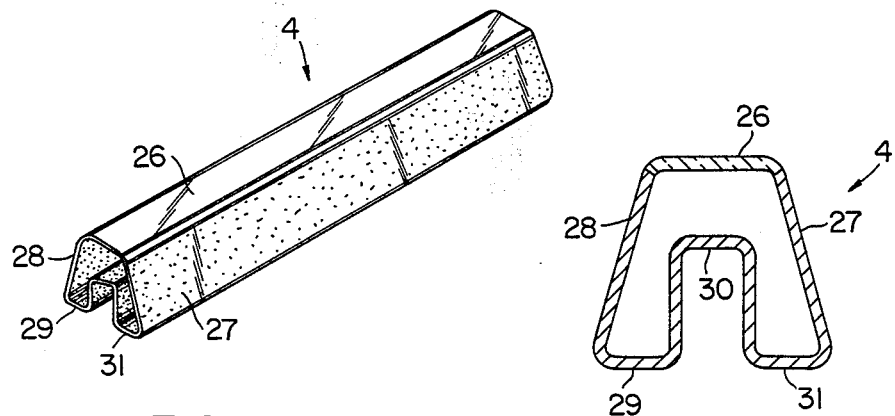
FIG. 3 is a perspective view of a prior art container.

FIG. 3 illustrates a prior art tube having conductive walls 27, 28, 29, and 31. Additionally, the walls which connected the bottom walls 29 and 31 are also of opaque, conducting material. Only the top surface 26 of the container 4 shown in FIG. 3 is transparent. Thus, the prior art tube does not readily permit inspection of all sides and all parts of an electrical component disposed therein.

Figure 4:
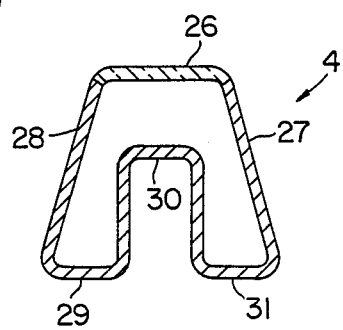
FIG. 4 is a sectional side view of a container of FIG. 3.

FIG. 4 is a sectional side view of the embodiment shown in FIG. 3, showing the opaque walls 27-31 and the transparent wall 26. As seen from FIG. 4, an electrical component can only be inspected by viewing through the wall 26.

FIG. 5 is a perspective view of a tube according to the present invention, which corresponds to the tube 1 shown in FIG. 1. Here, the opaque portions 33 and 32 are seen and are for providing electrical communication between the electrically conductive portions 17, 18, and 19 (only the portion 19 being visible in FIG. 5). Additionally, the conductive strips 17-19 provide electrical communication between the conductive portions 32 and 33 of the tube 1 of FIG. 5.

A tube 5 is shown in FIG. 6 containing an electrical component 7. The electrical component 7 has a pair of legs 34, 34 of an electrically conducting material.

It is well known that transparent plastic material is susceptible to buildup of an electrical charge in the form of static electricity. Conductive plastic portions, on the other hand, do not permit static buildup and can be grounded to a common potential (often called the ground potential). In order to prevent static discharges from affecting an electrical component disposed in a tube, the container according to the present invention has electrically conducting surfaces which are disposed in every region which the electrical component can touch. Thus, as seen in FIG. 6, edges of the component 7 which are in contact with the container 5 only contact electrically conducting films 35 and 38. The shoulder portions 36,36 and the bottom transparent portions 39 are all of transparent plastic material. The remainder of the body, including walls 40 and 41, are of transparent material. The dotted lines indicated at 37,37 illustrate an original form of container as seen in FIG. 3, to illustrate the advantageous nature of provision of the shoulders 36,36. In this fashion, the container of the present invention can be used for the same components as can the prior art container shown in FIGS. 3 and 4.

FIG. 7 shows a container 6 similar to that shown in FIG. 6, but having different proportions to accommodate a wider electrical component 8. Here, conductive shoulders 44 and 45 are provided, as is a conductive bottom 43. The legs 42 of the component 8 cannot come in contact with any transparent walls. The dotted lines shown in FIG. 7 (unnumbered) illustrate an original shape of a prior art container, and illustrate the advantage of providing the shoulders 44 and 45 to limit movement of the component 8. The remaining portions of the container 6 are of transparent plastic material, including walls 46, 47, and 48.

FIG. 8 illustrates the disposition of a component 7 in a container identical to that shown in FIG. 6. For the sake of discussion, FIG. 8 can be seen as an inverted container 5, such that gravity acts in an upward direction relative to the orientation shown in FIG. 8. Thus, the component 7 is forced upwardly relative to the orientation shown in FIG. 8, and even so, none of the parts of the component 7 touch any of the transparent walls of the container 5, but rather only touch electrically conductive portions.

FIG. 9 is a view similar to that shown in FIG. 8, but with the container and electrical component the same as that shown in FIG. 7. The same discussion applies for FIG. 9 as for FIG. 8 as to the contact of the component 8 only with electrically conducting portions of the container 6.

The electrical conducting films 35 and 38 may be preformed film strips of electrically conducting plastics or metal foil, which strips are adhered to the inner surfaces of the container 35 or which may be applied as a coating, by painting, or as a vapor deposition, for example. Any other suitable manner of disposing the strips or electrical conductors could also be used satisfactorily.

The contour, shape and size of the tubular container of this invention may be arranged in any manner so as to accommodate the shape and size of the component(s) contained therein.

Figures 10, 11:
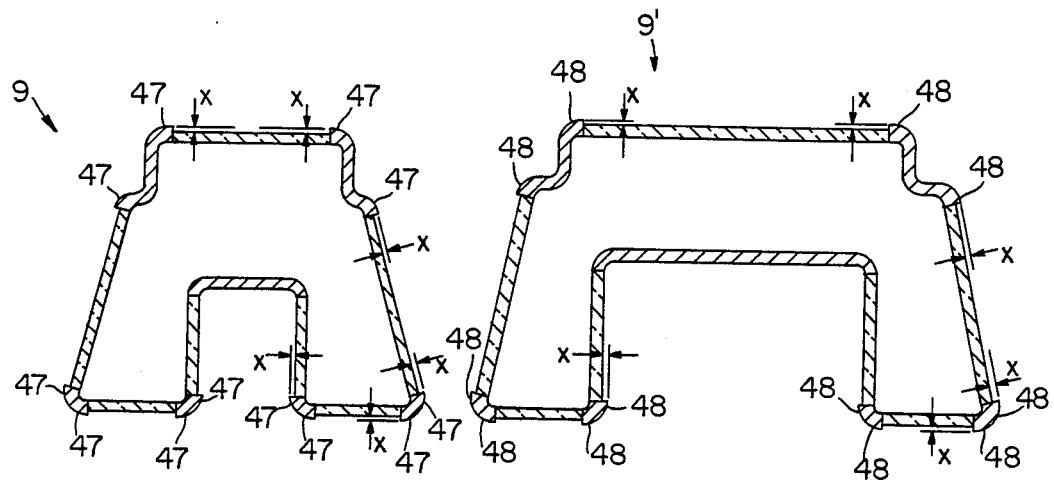
FIG. 10 is a side sectional view of another embodiment of the present invention.
FIG. 11 is a side sectional view similar to that shown in FIG. 10 but having different relative dimensions.

FIG. 10 illustrates another embodiment of the present invention having extruded ribs disposed at each of the conductive corners according to the present invention, to prevent wall-to-wall contact between adjacent containers 7. The ribs are shown as ribs 47 in FIG. 10, each rib providing a gap of a distance "x" as seen in FIG. 10 between the height of the rib and the surface of an adjacent transparent wall portion. The container 9 is similar in shape and construction to the container 1 shown in FIG. 1.

FIG. 11 is a container 9' similar to that shown in FIG. 10, but having wider dimensions to accommodate a wider component. Here also a gap x is provided between the surface of a transparent wall portion and a height of ribs 48.

The bulging corners, formed as the ribs 48, of the containers 9 and 9' prevent contact of transparent walls of any adjacent containers, as shown, and as discussed hereunder.

Figure 12:
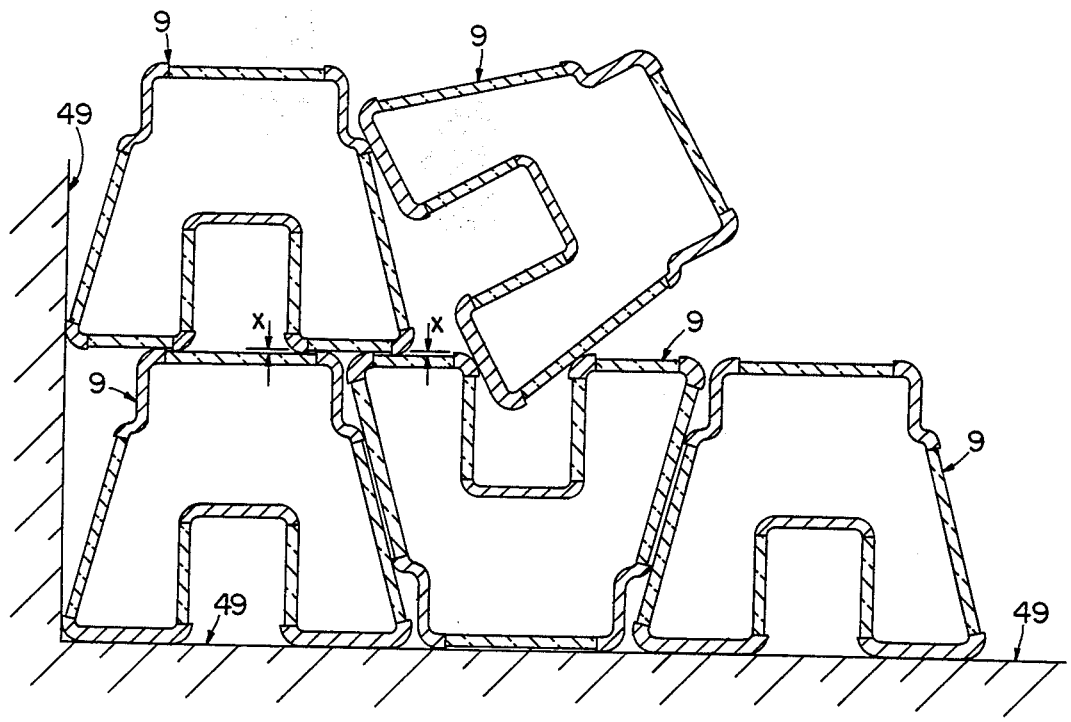
FIG. 12 illustrates a plurality of components in stacked relationship, the components being similar to that shown in FIG. 10.

FIG. 12 illustrates a plurality of containers 9 which are oriented variously in upright, upside down, and tilted positions relative to one another, to show that no two transparent wall surfaces come in contact with one another, due to the presence of the ribs. Gaps will always exist, shown as gaps "x" in FIG. 12, between nearby transparent wall portions. The containers 9 are shown as being disposed within a larger receptacle 49, only two of which walls of the container 49 are shown.

The bulging, electrically conductive corners of the tubes 9 in FIG. 12 serve to prevent any static charge buildup between adjacent tubes, such as would be caused by rubbing and other contact between the tubes 9 during transportation, packaging, and shipment.

The present container permits visual inspection of electrical components easily without removing these components from the container. A distinct advantage of the device of the present invention is that optical inspection devices can also be employed to inspect components in the present containers without disturbing the packaging thereof.

It is understood that the examples and embodiments described herein are for illustrative purposes only and that various modifications or changes in light thereof will be suggested to persons skilled in the art and are to be included within the spirit and purview of this application and the scope of the appended claims.

What is claimed is:

1. A container for electrical and electronic components having electrical contact legs, which are susceptible to damage by static electrical discharges, comprising:

a tubular casing composed of a continuous peripheral wall of a generally uniform wall thickness, said casing being adapted to receive the component; a plurality of inset shoulder portions formed by said wall and projecting inwardly toward an interior of said casing to restrict movement of the component; said tubular casing having at least one lengthwise electrically conducting strip on an inner surface of each one of said lengthwise inset shoulder means for engaging said component;

said tubular casing having a cross-section which is generally in a "U" shape; each leg of said "U" shape being substantially completely transparent; each said leg having an inner leg portion;

said tubular casing having a substantially completely transparent top portion connecting said inset shoulder portions;

said tubular casing having a leg connecting portion bridging said inner leg portions of each of said legs to form a rest for the component; said rest having an inner surface which is electrically conductive; substantially all remaining portions of said tubular casing being free of electrically conductive interior surfaces;

whereby permissible movement of the component within said tubular casing brings the component only into contact with one of said electrically conductive portions and not into direct contact with said transparent portions.

2. The container of claim 1 wherein said tubular casing is of material extruded from alternating bands of substantially transparent plastic and electrical conducting plastic, said bands of electrical conducting plastic forming at least a portion of said lengthwise inset shoulder means.

3. The container of claim 1 wherein an electrically conducting film is disposed over the inner surface of said lengthwise inset shoulder means to form each respective said electrically conducting strip and said inner surface of said rest.

4. The container of claim 1 wherein said tubular casing is composed of alternating strips of substantially transparent plastic substance and strips of opaque, electrically conducting plastic substance; said inner base being formed from said electrically conducting plastic;

said shoulders having corners; said corners of said inset shoulder portions being composed of an electrically conducting plastic substance; and the remainder of said container being composed of said substantially transparent plastic substance.

5. A container for electrical and electronic components having electrical contact legs, which components are susceptible to static electrical charges, the components while contained being movable in a limited range of motion, comprising:

a tubular casing constituted by a continuous peripheral wall of generally uniform cross-section having a main chamber and two projecting channels; said tubular casing having an outer wall surface and an inner wall surface;

said main chamber having a top wall and two side walls, said top wall being connected to each respective said side wall by an inset shoulder portion; each said side wall being extended to form an outer wall of each said channel; each said channel having an inner wall; said inner walls being connected along respective uppermost portions thereof by a bridging wall;

said tubular member being substantially entirely transparent;

said tubular member having a plurality of electrically conducting strips on such inner surfaces of said tubular member as are contactable by the component when said component is moved into any permissible orientation within said tubular member.

6. The container of claim 5 wherein said electrically conductive strips are fixed to interior surfaces of said tubular member as coatings or films.

7. The container of claim 5 wherein said tubular casing is formed by extrusion.

* * * * *